United States Patent
Bahr et al.

(10) Patent No.: US 11,063,558 B2
(45) Date of Patent: Jul. 13, 2021

(54) DIRECT-CURRENT TUNING OF BULK ACOUSTIC WAVE RESONATOR DEVICES

(71) Applicant: TEXAS INSTRUMENTS INCORPORATED, Dallas, TX (US)

(72) Inventors: Bichoy Bahr, Allen, TX (US); Baher Haroun, Allen, TX (US); Ting-Ta Yen, San Jose, CA (US); Ali Kiaei, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 209 days.

(21) Appl. No.: 16/114,708

(22) Filed: Aug. 28, 2018

(65) Prior Publication Data
US 2020/0076366 A1   Mar. 5, 2020

(51) Int. Cl.
*H03B 5/32* (2006.01)
*H03H 9/17* (2006.01)
(Continued)

(52) U.S. Cl.
CPC .......... *H03B 5/326* (2013.01); *H01L 41/047* (2013.01); *H01L 41/0805* (2013.01); *H03H 9/17* (2013.01);
(Continued)

(58) Field of Classification Search
CPC ..... H03H 2009/02196; H03H 9/02015; H03H 9/02102; H03H 9/02133; H03H 9/02149; H03H 9/131; H03H 9/17; H03H 9/171; H03L 1/02; H03L 1/028; H03L 5/00; H03L 7/02; H03B 5/04; H03B 5/1237; H03B 5/1275; H03B 5/129; H03B 5/32; H03B 5/323; H03B 5/326; H03B 2200/0022; H03B 2201/02; H03B 2201/0275; H01L 41/047; H01L 41/0805
(Continued)

(56) References Cited

U.S. PATENT DOCUMENTS 5,446,306 A * 8/1995 Stokes ............... H03H 9/02102
257/416
6,160,458 A * 12/2000 Cole ....................... H03L 1/026
331/158
(Continued)

FOREIGN PATENT DOCUMENTS

JP       11-168345 A  *  6/1999
JP    2010-093398 A  *  4/2010

OTHER PUBLICATIONS

C. Enz, et al., "Ultra Low-Power MEMS-based Radio for Wireless Sensor Networks," Circuit Theory and Design, European Conference on, 2007, ECCTD 2007. pp. 320-331.
(Continued)

*Primary Examiner* — Barbara Summons
(74) *Attorney, Agent, or Firm* — Michael A. Davis., Jr.; Charles A. Brill; Frank D. Cimino

(57) ABSTRACT

A system includes a tunable bulk acoustic wave (BAW) resonator device and a direct-current (DC) tuning controller coupled to the tunable BAW resonator device. The system also includes an oscillator circuit coupled to the tunable BAW resonator device. The DC tuning controller selectively adjusts a DC tuning signal applied to the tunable BAW resonator device to adjust a signal frequency generated by the oscillator circuit.

20 Claims, 11 Drawing Sheets

(51) Int. Cl.
  *H01L 41/08* (2006.01)
  *H01L 41/047* (2006.01)
  *H03H 9/205* (2006.01)
  *H03H 9/02* (2006.01)

(52) U.S. Cl.
  CPC ..... *H03H 9/205* (2013.01); *H03B 2200/0022* (2013.01); *H03H 2009/02196* (2013.01)

(58) Field of Classification Search
  USPC ......... 333/187, 188; 331/107 A, 116 R, 154, 331/162, 163, 177 R, 185, 48
  See application file for complete search history.

(56) References Cited

U.S. PATENT DOCUMENTS

| | | | | |
|---|---|---|---|---|
| 6,809,604 B2* | 10/2004 | Kawakubo | ........... | H03H 9/0095 331/107 A |
| 7,525,399 B2* | 4/2009 | Yanase | ................. | H03H 3/02 333/189 |
| 7,977,850 B2* | 7/2011 | Allah | ................. | H03H 9/174 310/320 |
| 8,912,866 B2* | 12/2014 | Yasuda | ................. | H03H 9/0542 333/133 |
| 9,680,446 B2* | 6/2017 | Yasuda | ............. | H03H 9/02834 |
| 9,929,718 B1* | 3/2018 | Qiu | ........... | H03H 9/542 |
| 10,312,882 B2* | 6/2019 | Qiu | ........... | H01P 1/201 |
| 2003/0025567 A1* | 2/2003 | Kubo | ................. | H03B 5/368 331/158 |
| 2006/0001329 A1* | 1/2006 | Rao | ................. | H03H 9/02102 310/315 |
| 2017/0033766 A1 | 2/2017 | Jacobsen et al. | | |

OTHER PUBLICATIONS

C. Enz, et al., "Building Blocks for an Ultra Low-Power MEMS-based Radio." IEEEE International Workshop on Radio-Frequency Integration Technology, Dec. 9-11, 2007, Singapore. pp. 158-167.

David Ruffieux, "A High-Stability, Ultra-Low-Power Differential Oscillator Circuit for Demanding Radio Applications," ESSCIRC 2002. pp. 85-88.

Y. Chang et al, "A Differential Digitally Controlled Crystal Oscillator With a 14-Bit Tuning Resolution and Sine Wave Outputs for Cellular Applications," IEEE JSSC (vol. 47, No. 2, pp. 421-434, Feb. 2012).

* cited by examiner

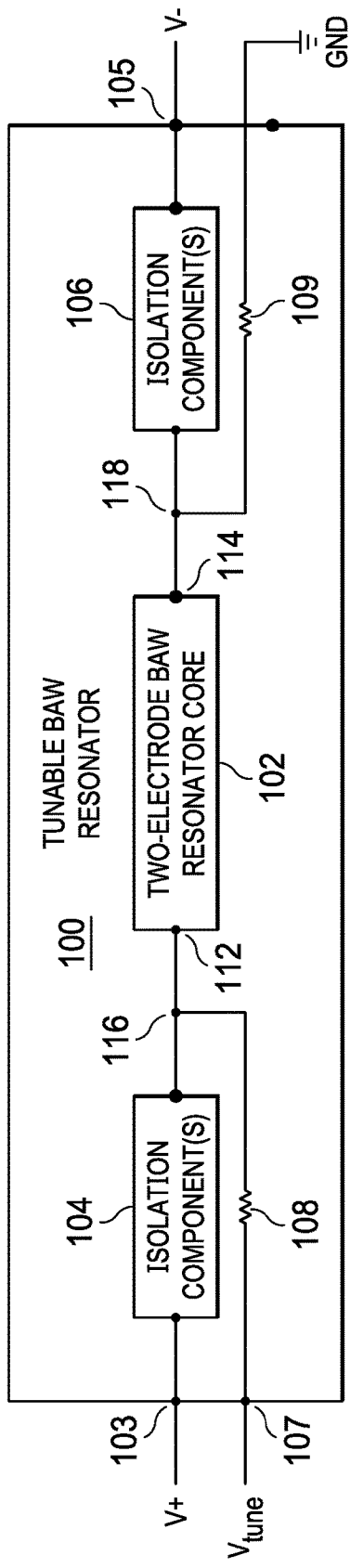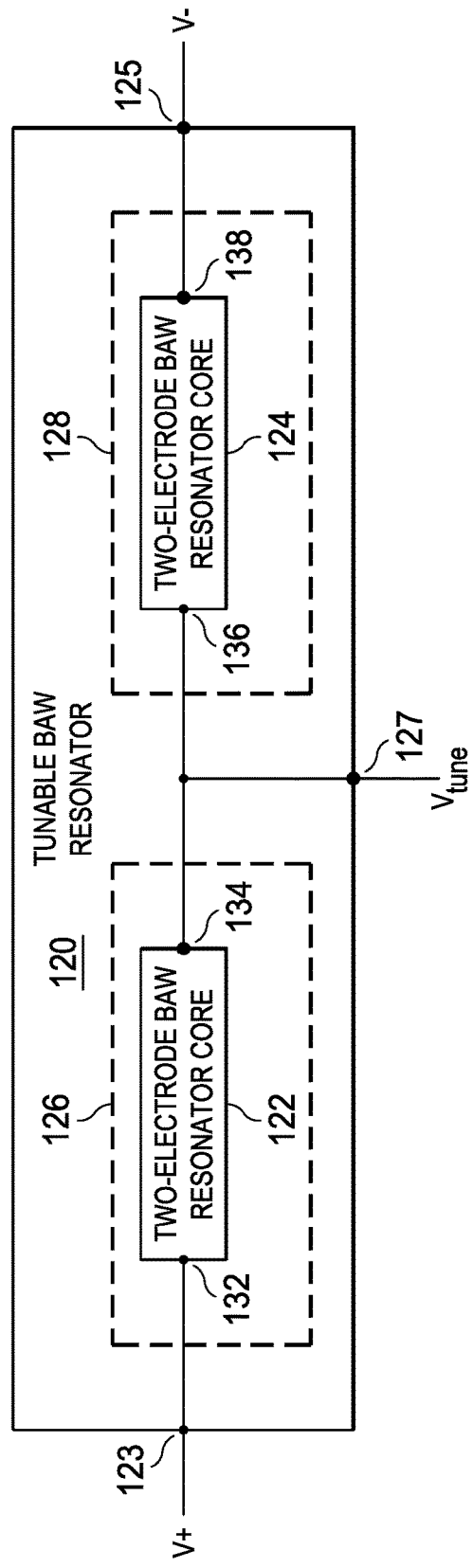
FIG. 1A
FIG. 1B

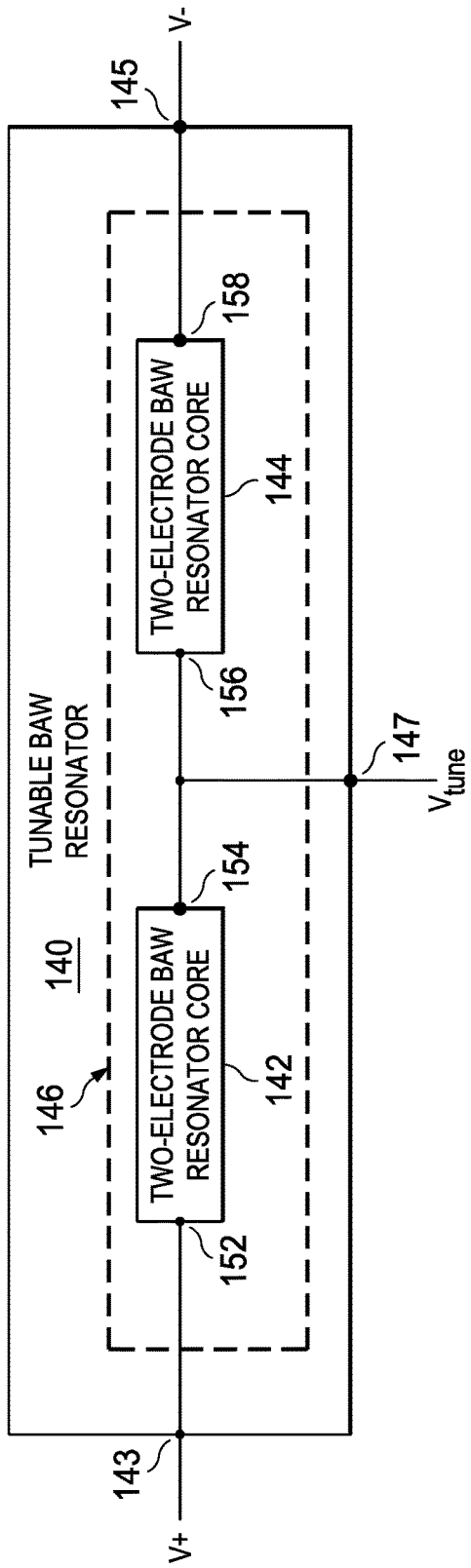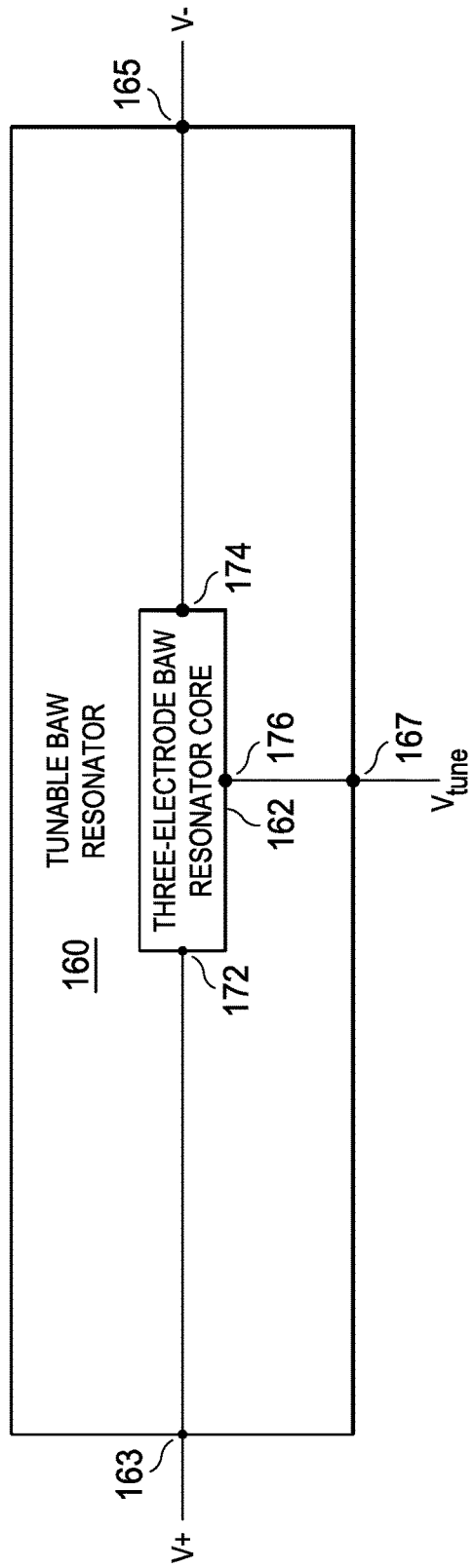

DIRECT-CURRENT TUNING OF BULK ACOUSTIC WAVE RESONATOR DEVICES

BACKGROUND

Timing devices are used as clock sources in a variety of modern electronic circuits. Such timing devices provide frequency control and timing for applications ranging from relatively simple crystal oscillators for mobile phones and radio transmitters to more complex timing devices for computers and navigational aids.

For portable clock applications, quartz crystal tuned oscillators (XOs) have good relative frequency accuracy, low frequency drift (or shift) as a function of temperature, and low noise. However, while the density of electronics has grown exponentially following Moore's law, the area and volume occupied by quartz crystals has not scaled accordingly.

To address the scaling issue for XOs, efforts have been directed toward replacing the XOs with silicon microelectromechanical (MEMS)-based resonators (or oscillators) as the frequency source for clocks. MEMs resonators are effectively time-base generators, or timing references, similar in operating principle to a mechanical tuning fork.

Bulk acoustic wave (BAW) resonators use a piezoelectric effect to convert electrical energy into mechanical energy resulting from an applied RF voltage and vice versa. A BAW resonator generally operates at its mechanical resonant frequency, which is defined as a frequency for which the half wavelength of sound waves propagating in the device is equal to a total piezoelectric layer thickness for a given velocity of sound for the material. BAW resonators operating in the GHz range generally have physical dimensions of tens of microns in diameter, with thicknesses of a few microns.

Although BAW resonators offer potential as a frequency reference, frequency tuning of a BAW resonator has been difficult to address. One suggested solution involves adding a capacitor across the BAW resonator, but that solution reduces quality factor and increases power consumption.

SUMMARY

In a first example, a system comprises a tunable bulk-acoustic wave (BAW) resonator device and a direct-current (DC) tuning controller coupled to the tunable BAW resonator device. The system also comprises an oscillator circuit coupled to the tunable BAW resonator device. The DC tuning controller selectively adjusts a DC tuning signal applied to the tunable BAW resonator device to adjust a signal frequency generated by the oscillator circuit.

In a second example, a method comprises selectively adjusting, by a direct-current (DC) tuning controller, a DC tuning signal applied to a tunable bulk-acoustic wave (BAW) resonator device to adjust a signal frequency of an oscillator circuit.

In a third example, a tunable BAW resonator device comprises a BAW resonator core. The BAW resonator core comprises a first electrode, a second electrode, and an electro-active material having a physical characteristic that changes in response to a DC tuning signal. The tunable BAW resonator device also comprises a first oscillator terminal coupled to the first electrode, and a second oscillator terminal coupled to the second electrode. The tunable BAW resonator device also comprises a DC tuning terminal, coupled to one of the electrodes or the electro-active material, to receive a DC tuning signal to adjust a center frequency of the tunable BAW resonator device.

In a fourth example, a tunable BAW resonator fabrication method comprises forming a first two-electrode BAW resonator core and forming a second two-electrode BAW resonator core. The method also comprises coupling a first electrode of the first two-electrode BAW resonator core to a first oscillator terminal, and coupling a first electrode of the second two-electrode BAW resonator core to a second oscillator terminal. The method also comprises coupling a direct current (DC) tuning terminal to respective second electrodes of the first and second two-electrode BAW resonator cores.

BRIEF DESCRIPTION OF THE DRAWINGS

FIGS. 1A-1D show tunable bulk acoustic wave (BAW) resonator devices in accordance with various examples.

DETAILED DESCRIPTION

Figure 2A:
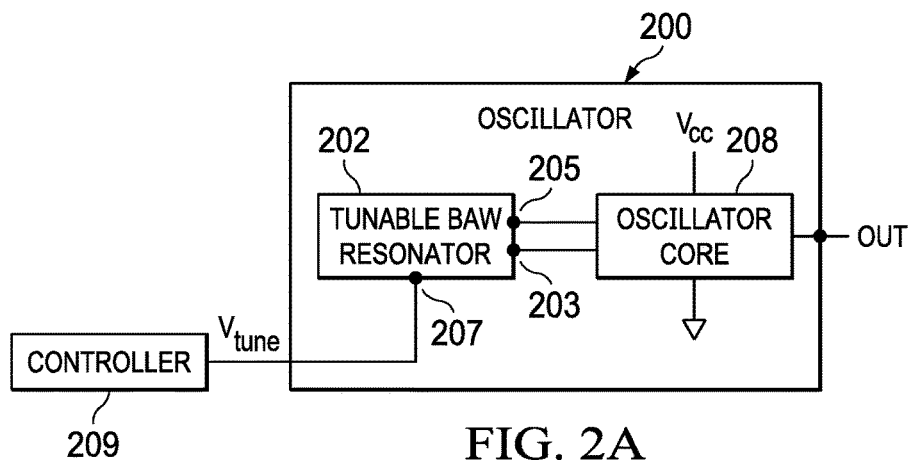
FIGS. 2A-2E show systems with tunable BAW resonator devices in accordance with various examples.

The examples described herein are directed to tunable bulk-acoustic wave (BAW) resonator devices and related systems, methods, and options. Without limitation, some tunable BAW resonator devices described herein have three terminals, where two of the terminals are oscillator terminals and the third terminal is a DC turning terminal. More specifically, the oscillator terminals of a tunable BAW resonator device are intended to be coupled to an oscillator circuit. Meanwhile, the DC turning terminal of a tunable BAW resonator device is intended to be coupled to a DC tuning controller. In some examples, the oscillator terminals and the DC tuning terminal of a tunable BAW resonator device are pins or pads of an integrated circuit or printed circuit board (PCB). In other examples, the oscillator terminals and DC tuning terminal of a tunable BAW resonator device are connection points in a circuit. For example, the oscillator terminals are connection points in a circuit where a tunable BAW resonator device is coupled to an oscillator circuit, and the DC tuning terminal is a connection point in a circuit where a tunable BAW resonator device is coupled to a DC tuning controller. For at least some tunable BAW resonator devices, the oscillator terminals are isolated from the DC tuning terminal.

When adjustments to the center frequency of a tunable BAW resonator device are desired (e.g., based on measurements and/or predetermined estimates related to frequency drift), a DC tuning controller generates and provides a DC tuning signal to the DC tuning terminal of a tunable BAW resonator device. The DC tuning signal causes electro-active material (e.g., piezoelectric materials and/or dielectric materials) of a tunable BAW resonator device to change a physical characteristic (e.g., size, internal stress/strain, and/or shape) of such material, resulting in a shifted center frequency for the tunable BAW resonator device. In some examples, tuning operations are performed once or periodically to adjust the signal frequency of an oscillator coupled to a tunable BAW resonator device. Such tuning is performed in response to default frequency errors and/or frequency drift due to various environmental/operational conditions, such as temperature, humidity, pressure, stress, aging, etc.).

Various tunable BAW resonator devices are possible. In different examples, a tunable BAW resonator device is made using a single two-electrode BAW resonator core, a pair of two-electrode BAW resonator cores, or a three-electrode BAW resonator core. Also, in different examples, a tunable BAW resonator device is formed in a single integrated circuit (IC), such as a semiconductor die with packaging. In other examples, a tunable BAW resonator device is formed in multiple ICs (e.g., at least two semiconductors dies packaged together or separately). Also, in different examples, a tunable BAW resonator device is part of a larger system, such as an oscillator, a clock, or any semiconductor device that includes an oscillator or clock (e.g., processors, transmitters, receivers, peripheral or network interfaces, radar components). In different examples, each larger system is implemented in a single IC (e.g., one semiconductor die with packaging) or multiple ICs (e.g., at least two semiconductors dies packaged together or separately). Various tunable BAW resonator device options, scenarios, and details are described below in reference to the drawings.

FIGS. 1A-1D show tunable BAW resonator devices in accordance with various examples. In FIG. 1A, a tunable BAW resonator device 100 with a single two-electrode BAW resonator core 102, a first oscillator terminal 103 (to receive a differential signal, V+), a second oscillator terminal 105 (to receive a differential signal, V−), and a DC tuning terminal 107 (to receive a DC tuning signal, Vtune) is represented. For the tunable BAW resonator device 100, the first oscillator terminal 103 is coupled to a first electrode 112 of the two-electrode BAW resonator core 102 via isolation component(s) 104 that block DC voltage from flowing between the first electrode 112 and the first oscillator terminal 103. Also, the second oscillator terminal 105 is coupled to a second electrode 114 of the two-electrode BAW resonator core 102 via isolation component(s) 106 that block DC voltage from flowing between the second electrode 114 and the second oscillator terminal 105. In various examples, the isolation component(s) 104 and 106 are capacitors. Further, the DC tuning terminal 107 is coupled to a connection point 116 between first electrode 112 and isolation component(s) 104 via a first resistor 108 to bias the voltage of Vtune received at the first electrode 112. Also, the second electrode 114 is coupled to ground via a second resistor 109 connected at a connection point 118 between the second electrode 114 and isolation component(s) 106. In different examples, the tunable BAW resonator device 100 represents a single IC, multiple ICs, and/or discrete components on a printed circuit board (PCB). Also, the terminals 103, 105, and 107 represent pins or pads of an IC, packaged chip, or PCB.

In an example operation, the first and second oscillator terminals 103 and 105 receive differential alternating current (AC) voltage signals (V+ and V−) that pass through the isolation component(s) 104 and 106 to the first and second electrodes 112 and 114 of the two-electrode BAW resonator core 102, resulting in default BAW resonator behavior (a series resonance at a specific frequency characterized by a minimal impedance, followed by a parallel resonance at a specific and higher frequency characterized by a high impedance between the electrodes 112 and 114 of the BAW resonator core 102). By selectively adjusting Vtune (applied at the DC tuning terminal 107), the center frequency of the tunable BAW resonator 100 is adjusted without passing Vtune to oscillator circuitry coupled to the first and second oscillator terminals 103 and 105. In one example, adjusting Vtune between 0-10V is sufficient to account for default frequency errors and/or frequency drift.

In FIG. 1B, a tunable BAW resonator device 120 with a pair of two-electrode BAW resonator cores 122 and 124, a first oscillator terminal 123 (to receive a differential AC signal, V+), a second oscillator terminal 125 (to receive a differential AC signal, V−), and a DC tuning terminal 127 (to receive a DC tuning signal, Vtune) is represented. For the tunable BAW resonator device 120, the first oscillator terminal 123 is coupled to a first electrode 132 of the two-electrode BAW resonator core 122. Meanwhile, the second oscillator terminal 125 is coupled to a first electrode 138 of the two-electrode BAW resonator core 124. The DC tuning terminal 127 is coupled to a second electrode 134 of the two-electrode BAW resonator core 122 and to a second electrode 136 of the two-electrode BAW resonator core 124. In FIG. 1B, the two-electrode BAW resonator core 122 is part of a first unit 126, while the two-electrode BAW resonator core 124 is part of a second unit 128. In different examples, the units 126 and 128 represent ICs, packaged chips, or PCBs. Also, the terminals 123, 125, and 127 represent pins or pads of an IC, packaged chip, or PCB.

In an example operation, the first and second oscillator terminals 123 and 125 receive differential AC voltage signals (V+ and V−) and pass the signals to a respective electrode. More specifically, V+ is received by the first electrode 132 of the two-electrode BAW resonator core 122, and V− is received by the first electrode 138 of the two-electrode BAW resonator core 124, resulting in default BAW resonator behavior (a series resonance at a specific frequency characterized by a minimal impedance, followed by a parallel resonance at a specific and higher frequency characterized by a high impedance between the electrodes 132 and 138 of the BAW resonator cores 122 and 124). In various examples, the two-electrode BAW resonator cores 122 and 124 are selected to having matching center frequencies. In one example, the two-electrode BAW resonator cores 122 and 124 are selected from the same semiconductor wafer and/or wafer section (e.g., adjacent or within a threshold distance to each other) to facilitate selection of BAW resonator cores with matching center frequencies. In another example, the two-electrode BAW resonator cores 122 and 124 are selected by testing their center frequencies and pairing BAW resonator cores whose center frequencies match to within a threshold tolerance. By selectively adjusting Vtune (applied at the DC tuning terminal 127), the center frequency of the tunable BAW resonator device 120 (each of the two-electrode BAW resonator cores 122 and 124 is affected) is adjusted. In one example, adjusting Vtune between 0-10V is sufficient to account for default frequency errors and/or frequency drift.

In FIG. 1C, a tunable BAW resonator device 140 with a pair of two-electrode BAW resonator cores 142 and 144, a first oscillator terminal 143 (to receive a differential AC signal, V+), a second oscillator terminal 145 (to receive a differential signal, V−), and a DC tuning terminal 147 (to receive a DC tuning signal, Vtune) is represented. For the tunable BAW resonator device 140, the first oscillator terminal 143 is coupled to a first electrode 152 of the two-electrode BAW resonator core 142. Meanwhile, the second oscillator terminal 145 is coupled to a first electrode 158 of the two-electrode BAW resonator core 144. Also, the DC tuning terminal 147 is coupled to a second electrode 154 of the two-electrode BAW resonator core 142 and a second electrode 156 of the two-electrode BAW resonator core 144. In FIG. 1C, the two-electrode BAW resonator cores 142 and 144 are part of a single unit 146, which represents an IC, packaged chip, or PCB. Also, the terminals 143, 145, and 147 represent pins or pads of an IC, packaged chip, or PCB.

In an example operation, the first and second oscillator terminals 143 and 145 receive differential AC voltage signals (V+ and V−) and pass the signals to a respective electrode. More specifically, V+ is received by the first electrode 152 of the two-electrode BAW resonator core 142, and V− is received by the first electrode 158 of the two-electrode BAW resonator core 144, resulting in default BAW resonator behavior (a series resonance at a specific frequency characterized by a minimal impedance, followed by a parallel resonance at a specific and higher frequency characterized by a high impedance between the electrodes 152 and 158 of the BAW resonator cores 142 and 144). In one example, the two-electrode BAW resonator cores 142 and 144 are selected from the same semiconductor wafer and/or wafer section (e.g., adjacent or within a threshold distance to each other) to facilitate selection of BAW resonator cores with matching center frequencies. In another example, the two-electrode BAW resonator cores 142 and 144 are selected by testing their center frequencies and pairing BAW resonator cores whose center frequencies match to within a threshold tolerance. By selectively adjusting Vtune (applied at the DC tuning terminal 147), the center frequency of the tunable BAW resonator device 140 (each of the two-electrode BAW resonator cores 142 and 144 is affected) is adjusted. In one example, adjusting Vtune between 0-10V is sufficient to account for default frequency errors and/or frequency drift.

In FIG. 1D, a tunable BAW resonator device 160 with a single three-electrode BAW resonator core 162, a first oscillator terminal 163 (to receive a differential signal, V+), a second oscillator terminal 165 (to receive a differential signal, V−), and a DC tuning terminal 167 (to receive a DC tuning signal, Vtune) is represented. For the tunable BAW resonator device 160, the first oscillator terminal 163 is coupled to a first electrode 172 of the three-electrode BAW resonator core 162. Meanwhile, the second oscillator terminal 165 is coupled to a second electrode 174 of the three-electrode BAW resonator core 162. Finally, the DC tuning terminal 167 is coupled to a third electrode 176 of the three-electrode BAW resonator core 162. In FIG. 1D, the three-electrode BAW resonator core 162 represents an IC. Meanwhile, the terminals 163, 165, and 167 represent pins or pads of an IC, packaged chip, or PCB.

In an example operation, the first and second oscillator terminals 163 and 165 receive differential AC voltage signals (V+ and V−) and pass the signals to a respective electrode. More specifically, V+ is received by the first electrode 172 of the three-electrode BAW resonator core 162, and V− is received by the second electrode 174 of the three-electrode BAW resonator core 162, resulting in default BAW resonator behavior (a series resonance at a specific frequency characterized by a minimal impedance, followed by a parallel resonance at a specific and higher frequency characterized by a high impedance between the electrodes 172 and 174 of the three-electrode BAW resonator core 162). By selectively adjusting Vtune (applied at the DC tuning terminal 167 and passed to the third electrode 176 of the three-electrode BAW resonator core 162), the center frequency of the tunable BAW resonator device 160 is adjusted. In one example, adjusting Vtune between 0-10V is sufficient to account for default frequency errors and/or frequency drift.

FIG. 2A is a block diagram of an oscillator system 200 including a tunable BAW resonator device 202 (e.g., one of the devices 100, 120, 140, or 160 in FIGS. 1A-1D). In FIG. 2A, the tunable BAW resonator device 202 has two oscillator terminals 203 and 205 coupled to an oscillator core 208. Meanwhile, a DC tuning terminal 207 of the tunable BAW resonator device 202 is coupled to a controller 209. In some examples, the controller 209 is separate from the oscillator system 200 as shown. In other examples, the controller 209 is included with the oscillator system 200. In operation, the controller 209 adjusts Vtune based on a temperature measurement, stress measurement, predetermined frequency drift values, and/or measured frequency drift values. In various examples, the controller 209 includes internal components to obtain temperature measurements, stress measurements, predetermined frequency drift values, and/or measured frequency drift values. In other examples, the controller 209 obtains temperature measurements, stress measurements, predetermined frequency drift values, and/or measured frequency drift values from external components (not shown).

In some examples, the oscillator system 200 is a stacked package (e.g., flip chip assembly) or a lateral package arrangement. In other examples, the tunable BAW resonator device 202 and oscillator core 208 are formed in a same integrated circuit die. Also, the oscillator core 208 has bond pads (not shown) for being coupled between a high voltage supply terminal (VCC) and a low voltage shown as a ground, and for being coupled to the oscillator terminals 203 and 205 of the tunable BAW resonator device 202.

In operation, the tunable BAW resonator device 202 is a very high-quality (very narrow band) bandpass filter, that together with the oscillator core 208 functions as a signal generator, generating sinusoidal or square output waveform at a predetermined and precise BAW series or parallel resonance frequency. In various examples, the oscillator core 208 comprises active and passive circuit elements (e.g., capacitors) capable of sustaining oscillations and amplifying the signal from the tunable BAW resonator device 202 to generate and provide the output signal shown as OUT. Construction features of the tunable BAW resonator device 202 (e.g., the thickness of its piezoelectric layer(s)) determines the oscillation frequency. In one example, the oscillator core 208 is a Colpitts oscillator.

Figure 2B:
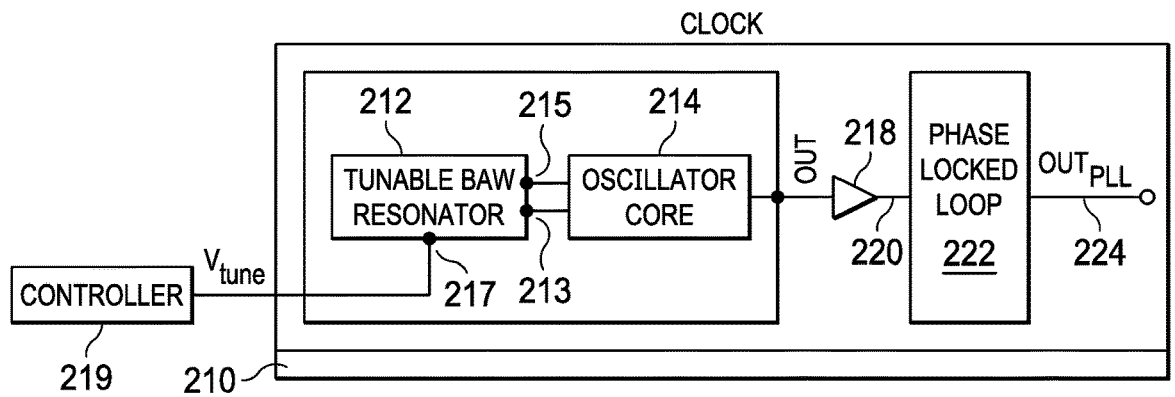

FIG. 2B is a block diagram of a clock system 210 including an oscillator system 216 (e.g., an example of the oscillator system 200 in FIG. 2A) coupled to a phase-lock-loop (PLL) 222. Similar to the oscillator system 200 of FIG. 2A, the oscillator system 216 of FIG. 2B includes a tunable BAW resonator device 212 (e.g., one of the devices 100, 120, 140, or 160 in FIGS. 1A-1D) with two oscillator terminals 213 and 215 coupled to an oscillator core 214, and with a DC tuning terminal 217 coupled to a controller 219. In at least some examples, the operation of the oscillator system 216 follows the operation of the oscillator system 200 of FIG. 2A, and the operation of the controller 219 follows the operation of the controller 209 of FIG. 2A.

The output of the oscillator system 216 (labeled OUT) is processed by a gain buffer 218, which outputs an amplified and buffered reference signal 220. The reference signal 222 is divided as desired and then input to the PLL 222 to generate a desired output frequency ($OUT_{PLL}$), where $OUT_{PLL}$ is the clock output for the clock system 210.

Figure 2C:
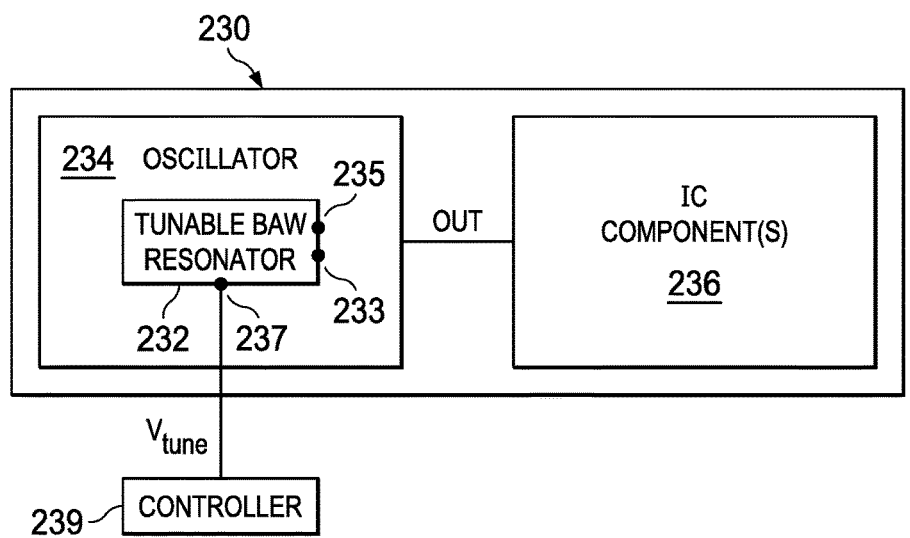

FIG. 2C is a block diagram of an IC system 230 including an oscillator system 234 (e.g., an example of the oscillator system 200 in FIG. 2A) and IC component(s) 236. Similar to the oscillator system 200 of FIG. 2A, the oscillator system 234 of FIG. 2C includes a tunable BAW resonator device 232 (e.g., one of the devices 100, 120, 140, or 160 in FIGS. 1A-1D) with two oscillator terminals 233 and 235 coupled to an oscillator core (not shown), and a DC tuning terminal 237 coupled to a controller 239. In at least some examples, the operation of the oscillator system 234 follows the operation of the oscillator system 200 of FIG. 2A, and the operation of the controller 239 follows the operation of the controller 209 of FIG. 2A. In various examples, the IC component(s) 236 include a processor, a transmitter, a receiver, a peripheral or network interface, and/or a radar component, where the IC component(s) 236 uses the OUT signal generated by the oscillator system 234.

Figure 2D:
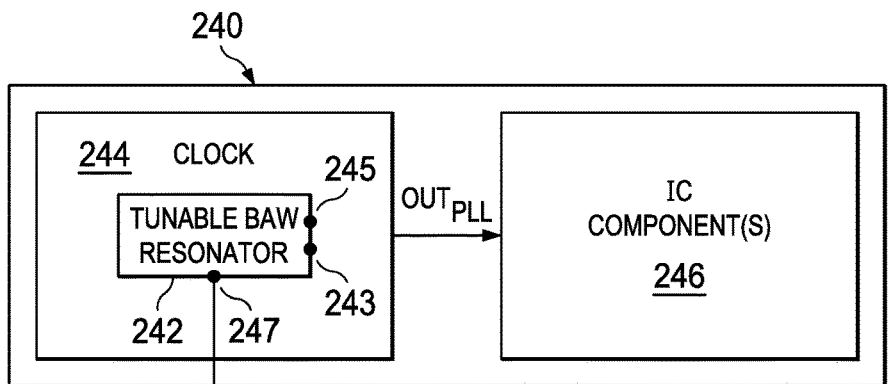

FIG. 2D is a block diagram of another IC system 240 including a clock system 244 (e.g., an example of the clock system 210 in FIG. 2B) and IC component(s) 246. Similar to the clock system 210 of FIG. 2B, the clock system 244 of FIG. 2D includes a tunable BAW resonator device 242 (e.g., one of the devices 100, 120, 140, or 160 in FIGS. 1A-1D) with two oscillator terminals 243 and 245 coupled to an oscillator core (not shown), and a DC tuning terminal 247 coupled to a controller 249. In at least some examples, the operation of the clock system 244 follows the operation of the Clock system 210 of FIG. 2B, and the operation of the controller 249 follows the operation of the controller 209 of FIG. 2A. In various examples, the IC component(s) 246 include a processor, a transmitter, a receiver, a peripheral or network interface, and/or a radar component, where the IC component(s) 246 uses the $OUT_{PLL}$ signal from the clock system 244.

In various other examples, an IC system includes both an oscillator system and a clock system. In different examples, tunable BAW resonator devices (e.g., one of the devices 100, 120, 140, or 160 in FIGS. 1A-1D), oscillator systems (e.g., one of the systems 200, 216, or 234 in FIGS. 2A-2C), clock systems (e.g., one of the systems 210 or 244 in FIGS. 2B and 2D), or IC systems (e.g., one of the systems 230 or 240 in FIGS. 2C and 2D) are implemented in one IC (one unpackaged or packaged die) or multiple ICs (multiple unpackaged or packaged dies). When multiple ICs are used, the ICs can be packaged together or separately. When packaged separately, a PCB is used to connect the separate packages.

Figure 2E:
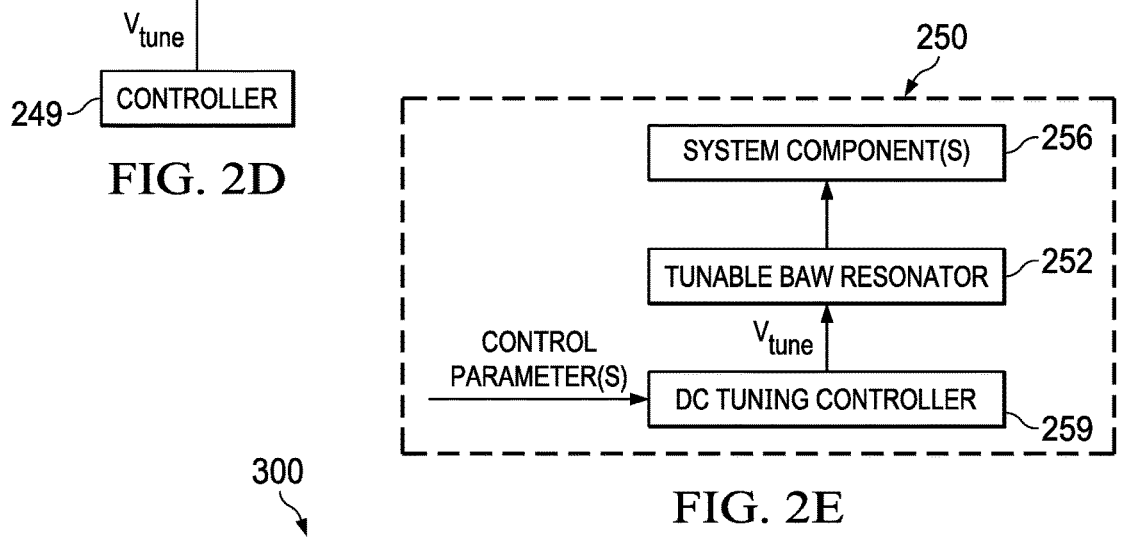

FIG. 2E shows block diagram of a generic system 250 that employs a tunable BAW resonator device 252. In different examples, the tunable BAW resonator device 252 is one of the devices described above (e.g., one of the devices 100, 120, 140, or 160 in FIGS. 1A-1D). In other examples, the tunable BAW resonator device 252 is a two-terminal BAW resonator device. In either case, the tunable BAW resonator device 252 receives a DC tuning voltage (Vtune) from a DC tuning controller 259 and provides resonator functionality for system component(s) 256. The system component(s) 256 are oscillator components (e.g., components used in an oscillator system, such as oscillator system 200 in FIG. 2A), clock components (e.g., components used in a clock system, such as clock system 210 in FIG. 2B), IC components (e.g., components used in an IC system, such as IC systems 230 and 240 in FIGS. 2C and 2D), and/or other components. In system 250, the DC tuning controller 259 generates and provides Vtune to the tunable BAW resonator device 252 in response to control parameter(s), such as temperature measurements, stress measurements, predetermined frequency drift values, and/or measured frequency drift values.

Figure 3A:
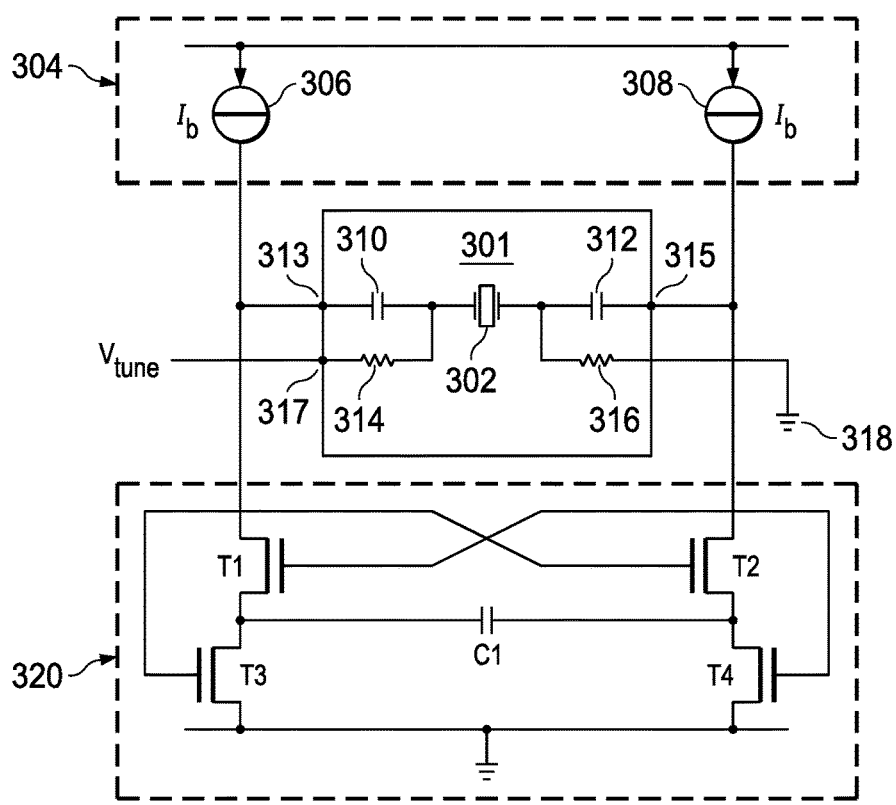
FIGS. 3A-3C are schematic diagrams of tunable BAW resonator devices coupled to oscillator circuitry in accordance with various examples.
Figure 3B:
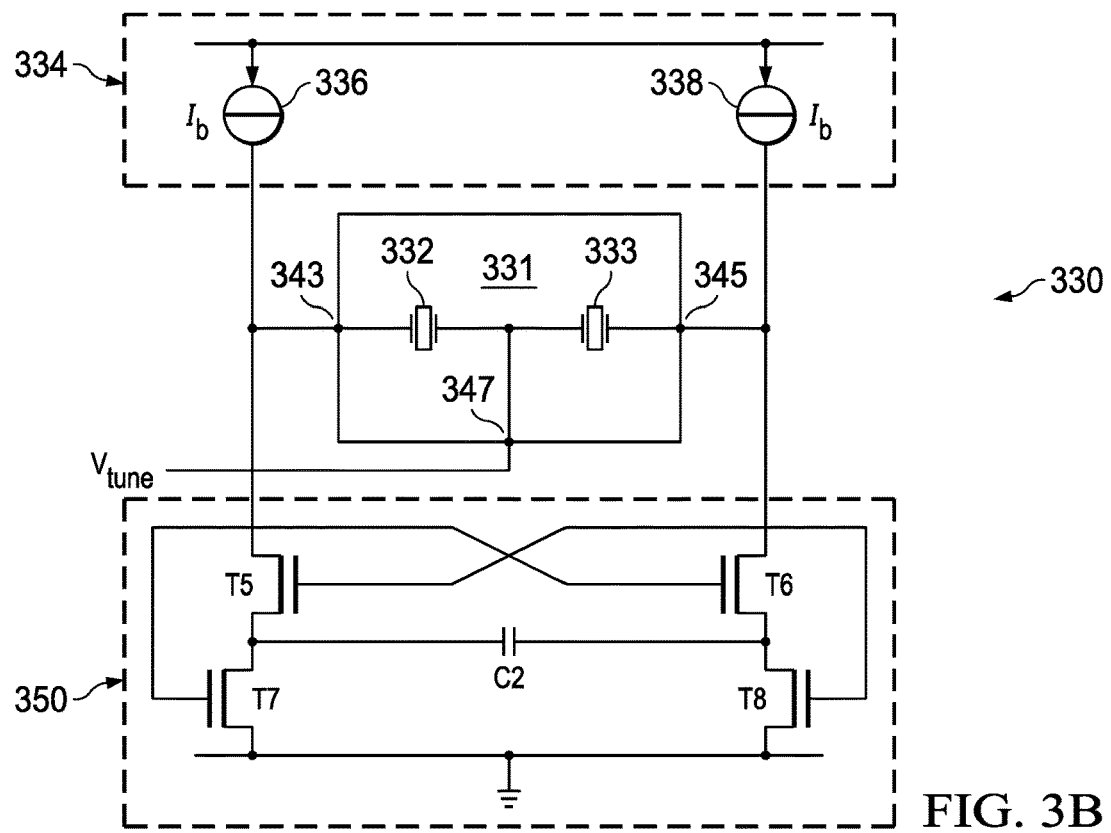
Figure 3C:
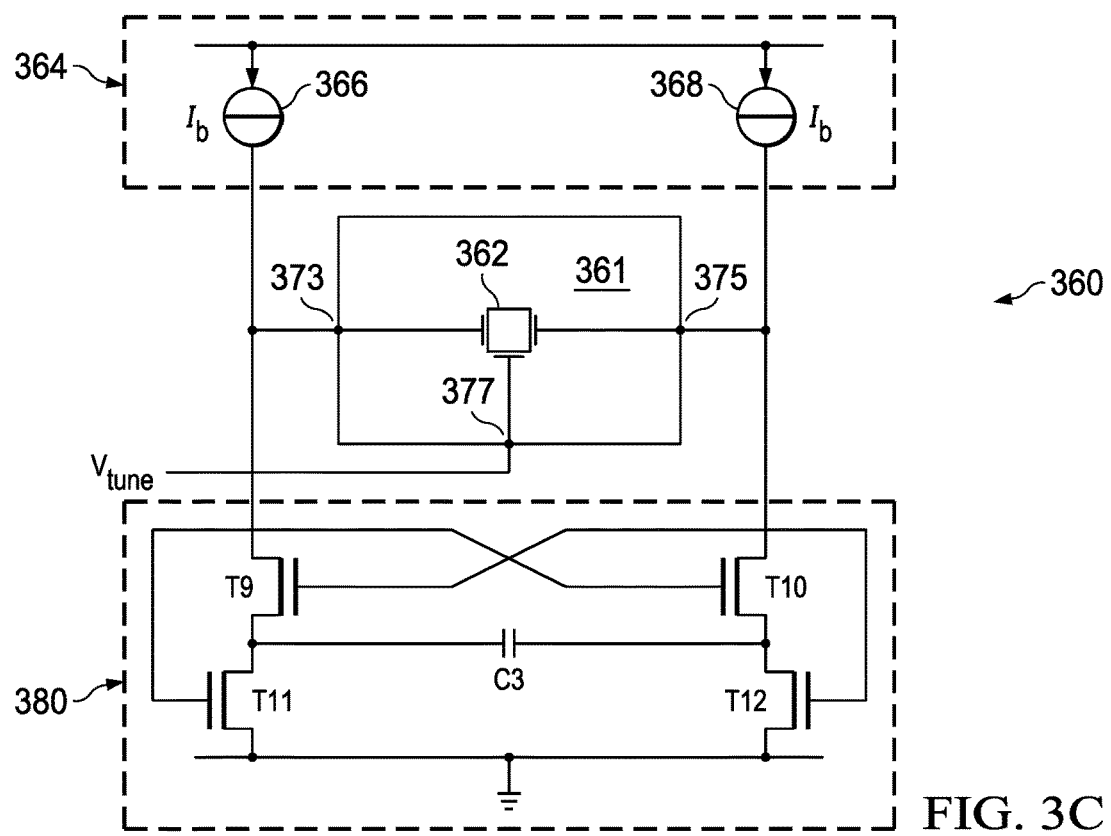

FIGS. 3A-3C show schematic diagrams of tunable BAW resonator devices coupled to oscillator circuitry in accordance with various examples. In FIG. 3A, an example oscillator schematic 300 includes a tunable BAW resonator device 301 that follows the arrangement given for the tunable BAW resonator device 100 in FIG. 1A. More specifically, the tunable BAW resonator device 301 has a two-electrode BAW resonator core 302, capacitors 310 and 312, and resistors 314 and 316 arranged as shown for the tunable BAW resonator device 100 in FIG. 1A.

In schematic 300, the first and second oscillator terminals 313 and 315 of the tunable BAW resonator 301 are coupled to respective transistors (T1 and T2) of an oscillator circuit 320. The oscillator circuit 320 also includes a capacitor (C1), and additional transistors (T3 and T4). As desired, T1 and T2 of the oscillator circuit 320 are biased by current sources 306 and 308 of a bias circuit 304. In different examples, the components of the bias circuit 304 (e.g., the component topology for the current sources 306 and 308), and the components of the oscillator circuit 320 (e.g., the oscillator core topology) may vary.

In FIG. 3B, an example oscillator schematic 330 includes a tunable BAW resonator device 331 that follows the arrangement given for the tunable BAW resonator devices 120 and 140 in FIGS. 1B and 1C. More specifically, the tunable BAW resonator device 331 has a pair of two-electrode BAW resonator cores 332 and 333 arranged as shown for the tunable BAW resonator devices 120 and 140 in FIGS. 1B and 1C.

In schematic 330, the first and second oscillator terminals 343 and 345 of the tunable BAW resonator 331 are coupled to respective transistors (T5 and T6) of an oscillator circuit 350. The oscillator circuit 350 also includes a capacitor (C2), and additional transistors (T7 and T8). As desired, T5 and T6 of the oscillator circuit 350 are biased by current sources 336 and 338 of a bias circuit 334. In different examples, the components of the bias circuit 334 (e.g., the component topology for the current sources 336 and 338), and the components of the oscillator circuit 350 (e.g., the oscillator core topology) may vary.

In FIG. 3C, an example oscillator schematic 360 includes a tunable BAW resonator device 361 that follows the arrangement given for the tunable BAW resonator device 160 in FIG. 1D. More specifically, the tunable BAW resonator device 361 has a single three-electrode BAW resonator core 362 arranged as shown for the tunable BAW resonator device 160 in FIG. 1D.

In schematic 360, the first and second oscillator terminals 373 and 375 of the tunable BAW resonator 361 are coupled to respective transistors (T9 and T10) of an oscillator circuit 380. The oscillator circuit 380 also includes a capacitor (C3), and additional transistors (T11 and T12). As desired, T9 and T10 of the oscillator circuit 380 are biased by current sources 366 and 368 of a bias circuit 364. In different examples, the components of the bias circuit 364 (e.g., the component topology for the current sources 366 and 368), and the components of the oscillator circuit 380 (e.g., the oscillator core topology) may vary.

Figure 4:
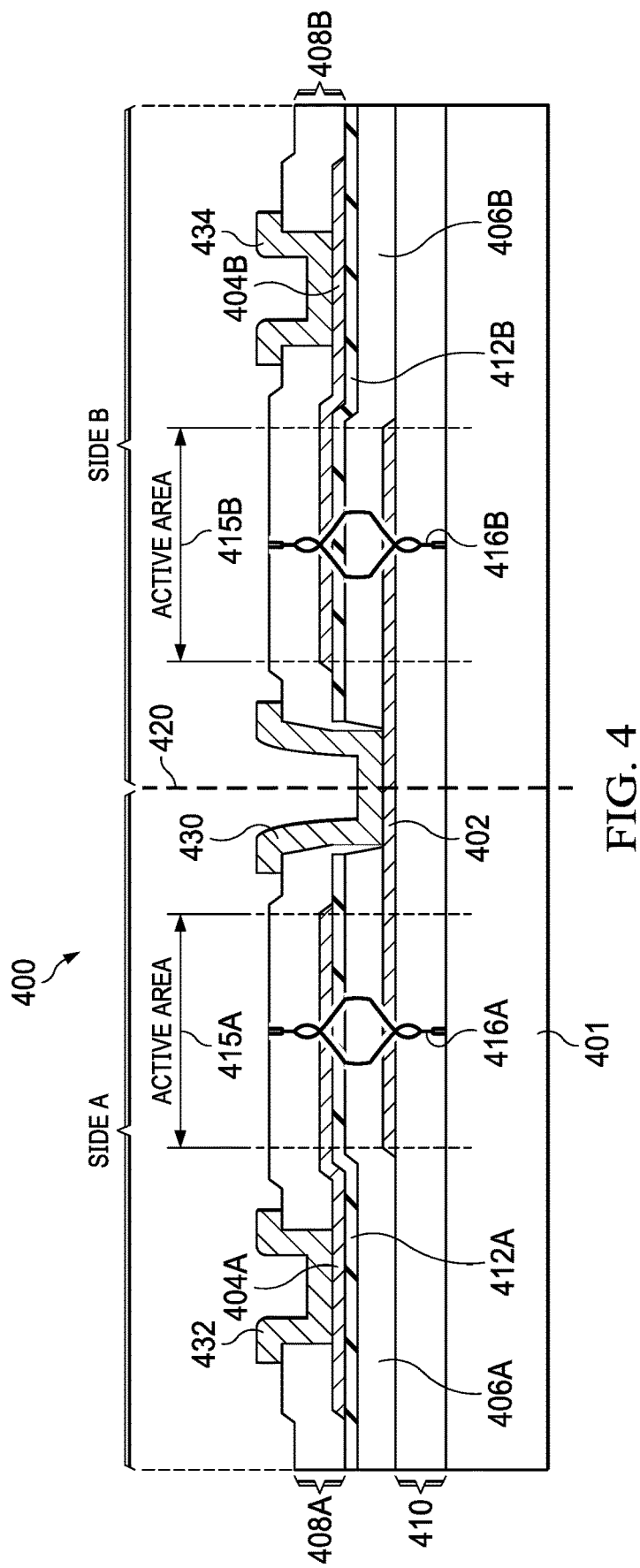
FIG. 4 is a cross-sectional view of a three-electrode BAW resonator core in accordance with various examples.

FIG. 4 shows a cross-sectional view of a three-electrode BAW resonator core 400 (e.g., the three-electrode BAW resonator core 162 in FIG. 1D) in accordance with various examples. The three-electrode BAW resonator core 400 in FIG. 4 is an example of a solidly mounted resonator (SMR) that includes various layers formed over a semiconductor substrate 401. More specifically, the layers formed over the semiconductor substrate 401 include electro-active materials 410 (e.g., Bragg mirrors), a bottom electrode 402, electro-active materials 406A and 406B (e.g., piezoelectric materials), insulative layers 412A and 412B, top electrodes 404A and 404B, and electro-active materials 408A and 408B (e.g., Bragg mirrors). The three-electrode BAW resonator core 400 also includes a first metal node 432 coupled to the top electrode 404A, a second metal node 434 coupled to the other top electrode 404B, and a third metal node 430 coupled to the bottom electrode 402. In some examples, the metal node 430 is the DC tuning terminal 167 in FIG. 1D, the metal node 432 is the oscillator terminal 163 in FIG. 1D, and the metal node 434 is the oscillator terminal 165 in FIG. 1D. In other examples, the metal nodes 430, 432, 434 are coupled to external metal terminals (not shown) that facilitate coupling the three-electrode BAW resonator core 400 to other components (e.g., components of an oscillator unit, a clock unit, or an IC unit).

In various examples: the substrate 401 is formed from silicon; the electro-active materials 410 include layers from different materials, such as silicon carbide (SiC), methyl silsesquioxane (MSQ), silicon dioxide (SiO2), silicon carbo hydroxide (SiCOH), silicon nitride (SiN), tungsten (W), titanium tungsten (TiW), or copper (Cu); and the bottom electrode 402 is formed from a metal, such as W, Cu, Aluminum (Al), or molybdenum (Mo). Also, in various examples: the electro-active materials 406A and 406B are formed from aluminum nitride (AlN) or lead zirconate titanate (PZT); the insulative layers 412A and 412B are formed from an oxide material; the top electrodes 404A and 404B are formed from a metal, such as W, Cu, Al or Mo; and the electro-active materials 408A and 408B include layers from different materials, such as SiC, MSQ, SiO2, SiCOH, SiN, W, TiW or Cu.

In operation, the three-electrode BAW resonator core 400 has two active area 415A and 415B, where mechanical energy is confined and isolated. The active areas 415A and 415B are created by the various layers and applied signals. More specifically, the active area 415A occurs where overlap exists between the bottom electrode 402 and the top electrode 404A. Also, the active area 415B occurs where overlap exists between the bottom electrode 402 and the top electrode 404B. As shown, some of the layers used to create the active areas 415A and 415B are shared (e.g., the substrate 401, the electro-active materials 410, and the bottom electrode 402), while other layers are separated and are on opposite sides of the metal node 430 (e.g., mirrored from line 420). More specifically, the electro-active materials 406A, the top electrode 404A, and the electro-active materials 408A, are arranged to the left side of the metal node 430 and contribute to the active area 415A. Meanwhile, the electro-active materials 406B, the top electrode 404B, and the electro-active materials 408B, are arranged to the right side of the metal node 430, and contribute to the active area 415B. When a DC tuning voltage is applied (via the metal node 430 and the bottom electrode 402, the behavior of the active areas 415A and 415B is modified due to the effect of the DC voltage on a physical characteristic (e.g., size, internal stress/strain, and/or shape) of one or more of the electro-active materials 410, 406A, 406B, 408A, and 408B, such that the center frequency of the three-electrode BAW resonator core 400 is shifted.

Figure 5:
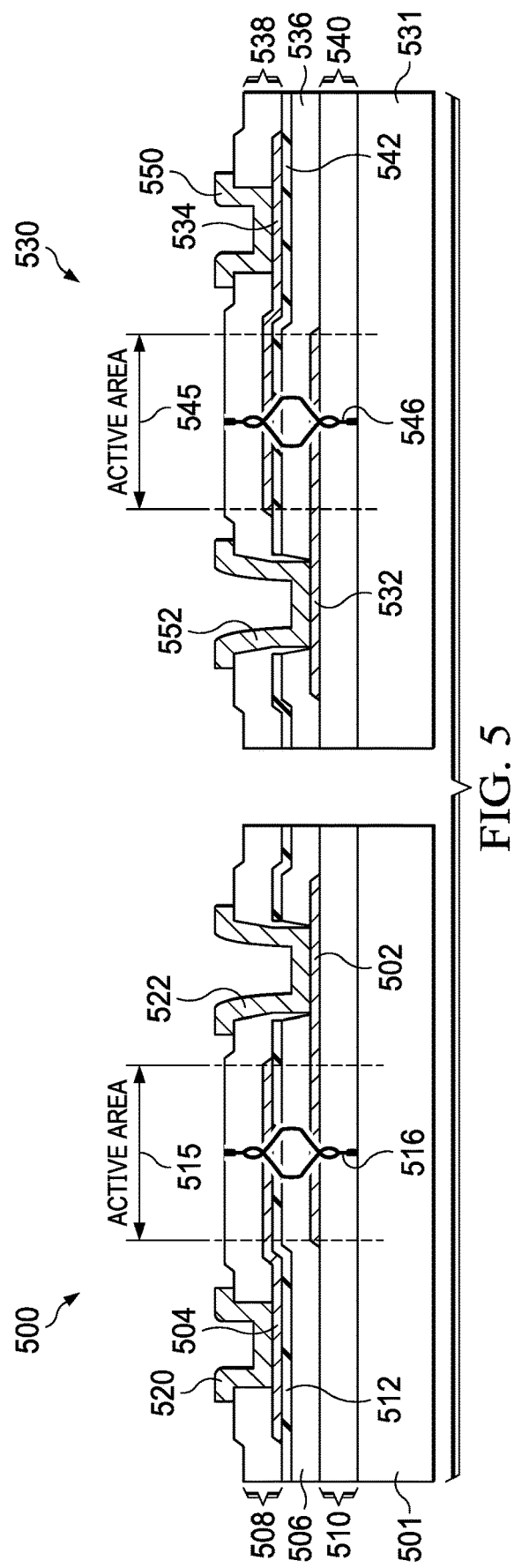
FIG. 5 is a cross-sectional view of a pair of two-electrode BAW resonator cores in accordance with various examples.

FIG. 5 shows a cross-sectional view of a pair of two-electrode BAW resonator cores 500 and 530 used for a tunable BAW resonator device in accordance with various examples (such as FIGS. 1B and 1C). Each of two-electrode BAW resonator cores 500 and 530 in FIG. 5 is an example of an SMR that includes various layers formed over respective semiconductor substrates 501 and 531. As shown in FIG. 5, the two-electrode BAW resonator core 500 includes various layers formed over a semiconductor substrate 501. More specifically, the layers formed over the semiconductor substrate 501 include electro-active materials 510 (e.g., Bragg mirrors), a bottom electrode 502, electro-active materials 506 (e.g., piezoelectric materials), an insulative layer 512, a top electrode 504, and electro-active materials 508 (e.g., Bragg mirrors). The two-electrode BAW resonator core 500 also includes a first metal node 520 coupled to the top electrode 504, and a second metal node 522 coupled to the bottom electrode 502. In some examples, the metal node 520 is oscillator terminal 123 (of the device 120 in FIG. 1B) or oscillator terminal 143 (of the device 140 in FIG. 1C). In other examples, the metal node 520 is coupled to an external metal terminal (not shown) that facilitates coupling a tunable BAW device with the pair of two-electrode BAW resonator cores 500 and 530 to other components (e.g., components of an oscillator unit, a clock unit, or an IC unit). Also, in some examples, the second metal node 522 is coupled to an external metal terminal (not shown), which is the DC tuning terminal 127 (of the device 120 in FIG. 1B) or the DC tuning terminal 147 (of the device 140 in FIG. 1C).

The second two-electrode BAW resonator core 530 also includes various layers formed over a semiconductor substrate 531. More specifically, the layers formed over the semiconductor substrate 531 include electro-active materials 540 (e.g., Bragg mirrors), a bottom electrode 532, electro-active materials 536 (e.g., piezoelectric materials), an insulative layer 542, a top electrode 534, and electro-active materials 538 (e.g., Bragg mirrors). The two-electrode BAW resonator core 530 also includes a first metal node 550 coupled to the top electrode 534, and a second metal node 552 coupled to the bottom electrode 532. In some examples, the first metal node 550 is oscillator terminal 125 (of the device 120 in FIG. 1B) or oscillator terminal 145 (of the device 140 in FIG. 1C). In other examples, the first metal node 550 is coupled to an external metal terminal (not shown) that facilitates coupling a tunable BAW device with the pair of two-electrode BAW resonator cores 500 and 530 to other components (e.g., components of an oscillator unit, a clock unit, or an IC unit). Also, in some examples, the second metal node 552 is coupled to an external metal terminal (not shown), which is the DC tuning terminal 127 (of the device 120 in FIG. 1B) or the DC tuning terminal 147 (of the device 140 in FIG. 1C). In the above description, the top electrodes 504 and 534 are coupled to separate oscillator terminals, while the bottom electrodes 502 and 532 are coupled to a DC turning terminal. In other examples, the top electrodes 504 and 534 are coupled to a DC tuning terminal, while the bottom electrodes 502 and 532 are coupled to separate oscillator terminals.

In various examples: the substrates 501 and 531 are formed from silicon; the electro-active materials 510 and 540 include layers from different materials, such as SiC, MSQ, SiO2, SiCOH, SiN, W, TiW or Cu; and the bottom electrodes 502 and 532 are formed from a metal, such as W, Cu, Al or Mo. Also, in various examples: the electro-active materials 506 and 536 are formed from AlN or PZT; the insulative layers 512 and 542 are formed from oxide materials; the top electrodes 504 and 534 are formed from a metal, such as W, Cu, Al or Mo; and the electro-active materials 508 and 538 include layers from different materials, such as SiC, MSQ, SiO2, SiCOH, SiN, W, TiW or Cu.

In operation, the pair of two-electrode BAW resonator cores 500 and 530 have two active area 515 and 545, where mechanical energy is confined and isolated. The active areas 515 and 545 are created by the various layers and applied signals. More specifically, the active area 515 occurs where overlap exists between the bottom electrode 502 and the top electrode 504 in the two-electrode BAW resonator core 500. Meanwhile, the active area 545 occurs where overlap exists between the bottom electrode 532 and the top electrode 534 in the two-electrode BAW resonator core 530. When a DC tuning voltage is applied (passed to the metal nodes 522 and 552 and then the bottom electrodes 502 and 532), the behavior of the active areas 515 and 545 is modified due to the effect of the DC voltage on a physical characteristic (e.g., size, internal stress/strain, and/or shape) of one or more of the electro-active materials 510, 540, 506, 536, 508 and 538, such that the center frequency of each two-electrode BAW resonator core 500 and 530 is shifted.

In various examples, the tunable BAW resonator devices described herein are formed using SMR cores (e.g., the cores 400, 500, and 530 in FIGS. 4 and 5). In other examples, the tunable BAW resonator devices described herein are formed using film bulk acoustic resonator (FBAR) cores. FBARs are mechanical resonators formed from electro-active materials (e.g., piezoelectric materials) sandwiched between two metal electrodes. The main difference between FBAR and SMR is that FBARs employ a "released" structure, such that the electro-active materials and electrodes are freely suspended in space, with the help of some support beams or layers. FBARs have free boundary conditions at the outer surfaces of the electrodes as opposed to SMRs where the electrodes are part of a solid structure without air gaps.

Figure 6A:
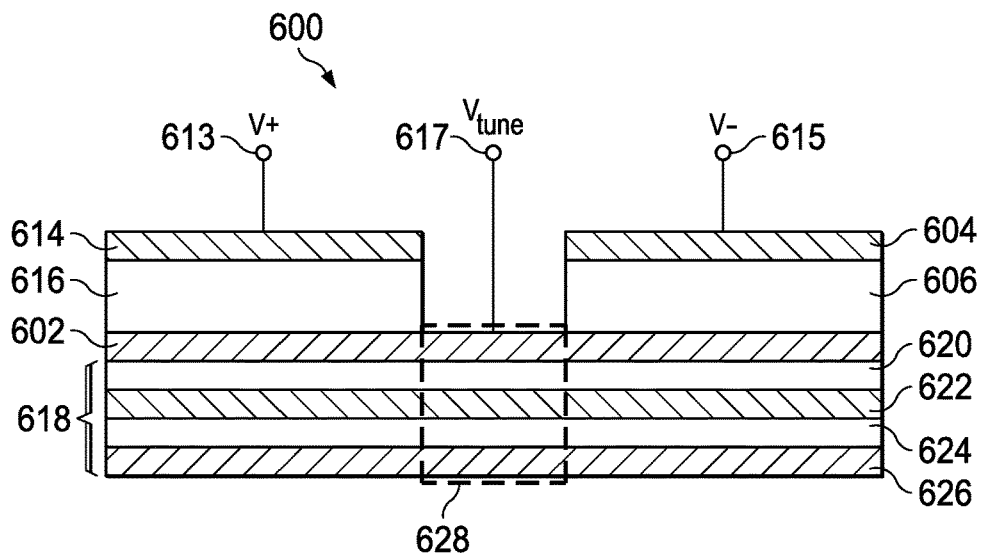
FIGS. 6A-6C are block diagrams of BAW resonator cores and related terminals in accordance with various examples.
Figure 6B:
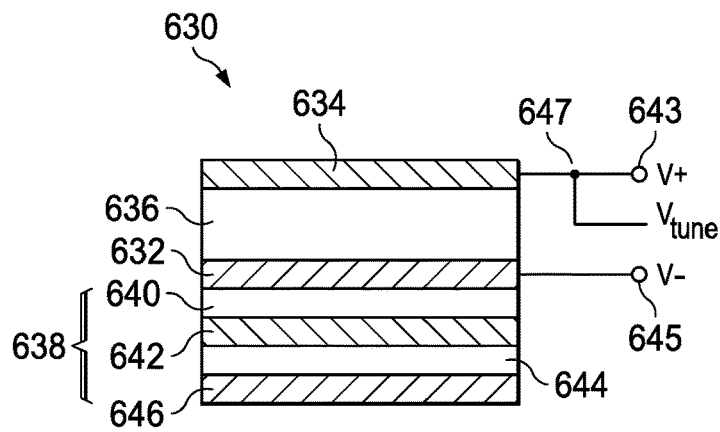
Figure 6C:
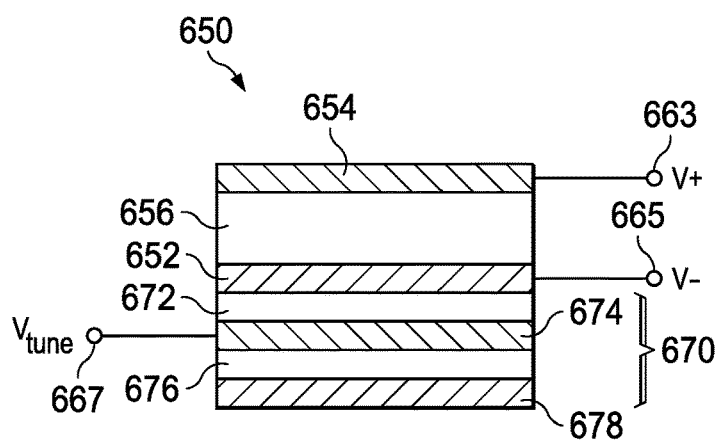

FIGS. 6A-6C show block diagrams of BAW resonator cores and related terminals in accordance with various examples. In FIG. 6A, certain layers of a three-electrode BAW resonator core 600 are represented (e.g., example layers of the three-electrode BAW resonator core 400 of FIG. 4). As shown, the represented layers include a set of acoustic mirror layers 618 that alternate between dielectric or ferroelectric layers 620 and 624, and acoustic mirror metal layers 622 and 626. In different examples, the number of layers in the set of acoustic mirror layers 618 varies. A bottom electrode 602 is formed above the set of acoustic mirror layers 618. Above the bottom electrode 602, separate piezoelectric layers 616 and 606 are formed. Finally, top electrodes 614 and 604 are formed above respective piezoelectric layers 616 and 606.

With the three-electrode BAW resonator core 600 represented in FIG. 6A, the top electrode 614 is coupled to an oscillator terminal 613 (e.g., to receive a differential AC signal, V+), and the other top electrode 604 is coupled to another oscillator terminal 615 (e.g., to receive a differential AC signal, V−). The bottom electrode 602 is coupled to a DC tuning terminal 617 (e.g., to receive a DC tuning signal, Vtune). In another example, the DC tuning terminal 617 is coupled to one of the acoustic mirror metal layers 622 or 626, instead of (or in addition to) the bottom electrode 602. Also, in some examples, the differential AC signal received by each of the top electrodes 604 and 614 is switched so that top electrode 614 receives the differential AC signal V− instead of V+, and top electrode 604 receives the differential AC signal V+ instead of V−. When Vtune is applied, the center frequency for the three-electrode BAW resonator core 600 is shifted.

In some examples, a pair of two-electrode BAW resonator cores (e.g., cores 500 and 530 in FIG. 5) are used together, instead of a three-electrode BAW resonator core. This scenario can be seen by removing section 628 of the three-electrode BAW resonator core 600. In such examples, a DC tuning terminal (e.g., terminal 617) is coupled to a bottom electrode and/or to an acoustic mirror metal layer for each two-electrode BAW resonator core. Meanwhile, the top electrodes of each two-electrode BAW resonator core are coupled to different oscillator terminals (e.g., one to V+ and the other to V−). When Vtune is applied, the center frequency for each two-electrode BAW resonator core is shifted.

In FIG. 6B, certain layers of a two-electrode BAW resonator core 630 are represented (e.g., example layers for either of the two-electrode BAW resonator cores 500 and 530 of FIG. 5). As shown, the represented layers include a set of acoustic mirror layers 638 that alternate between dielectric or ferroelectric layers 640 and 644, and acoustic mirror metal layers 642 and 646. In different examples, the number of layers in the set of acoustic mirror layers 638 varies. A bottom electrode 632 is formed above the set of acoustic mirror layers 638. Above the bottom electrode 632, a piezoelectric layer 636 is formed. Finally, a top electrode 634 is formed above the piezoelectric layer 636.

With the two-electrode BAW resonator core 630 represented in FIG. 6B, the top electrode 634 is coupled to an oscillator terminal 643 (e.g., to receive a differential AC signal, V+), and the bottom electrode 632 is coupled to another oscillator terminal 645 (e.g., to receive a differential AC signal, V−). The top electrode 634 also is coupled to a DC tuning terminal 647 (e.g., to receive a DC tuning signal, Vtune). As desired, an isolator is positioned between the oscillator terminal 643 and the DC tuning terminal 647 to prevent the DC tuning signal from being passed to oscillator core components (such as in FIGS. 1A and 3A). In some other examples, the electrodes 632 and 634 are coupled to different oscillator terminals (e.g., electrode 632 to a V+ terminal and electrode 634 to a V+ terminal). When Vtune is applied, the center frequency for the two-electrode BAW resonator core 630 is shifted.

In FIG. 6C, certain layers of a two-electrode BAW resonator core 650 are represented (e.g., example layers for either of the two-electrode BAW resonator cores 500 and 530 of FIG. 5). As shown, the represented layers include a set of acoustic mirror layers 670 that alternate between dielectric or ferroelectric layers 672 and 676, and acoustic mirror metal layers 674 and 678. In different examples, the number of layers in the set of acoustic mirror layers 670 varies. A bottom electrode 652 is formed above the set of acoustic mirror layers 670. Above the bottom electrode 652, a piezoelectric layer 656 is formed. Finally, a top electrode 654 is formed above the piezoelectric layer 656.

With the two-electrode BAW resonator core 650 represented in FIG. 6C, the top electrode 654 is coupled to an oscillator terminal 663 (e.g., to receive a differential signal, V+), and the bottom electrode 652 is coupled to another oscillator terminal 665 (e.g., to receive a differential signal, V−). Meanwhile, a DC tuning terminal 667 is coupled to the acoustic mirror metal 674 of the two-electrode BAW resonator core 650. When Vtune is applied, a static mechanical stress along with mechanical strain are induced in the mirror stack (either by electrostatic attraction or by piezoelectric effect if layer 672 is ferroelectric. The static stress is coupled to the entire structure, which causes the center frequency for the two-electrode BAW resonator core 650 to be shifted.

Figure 7:
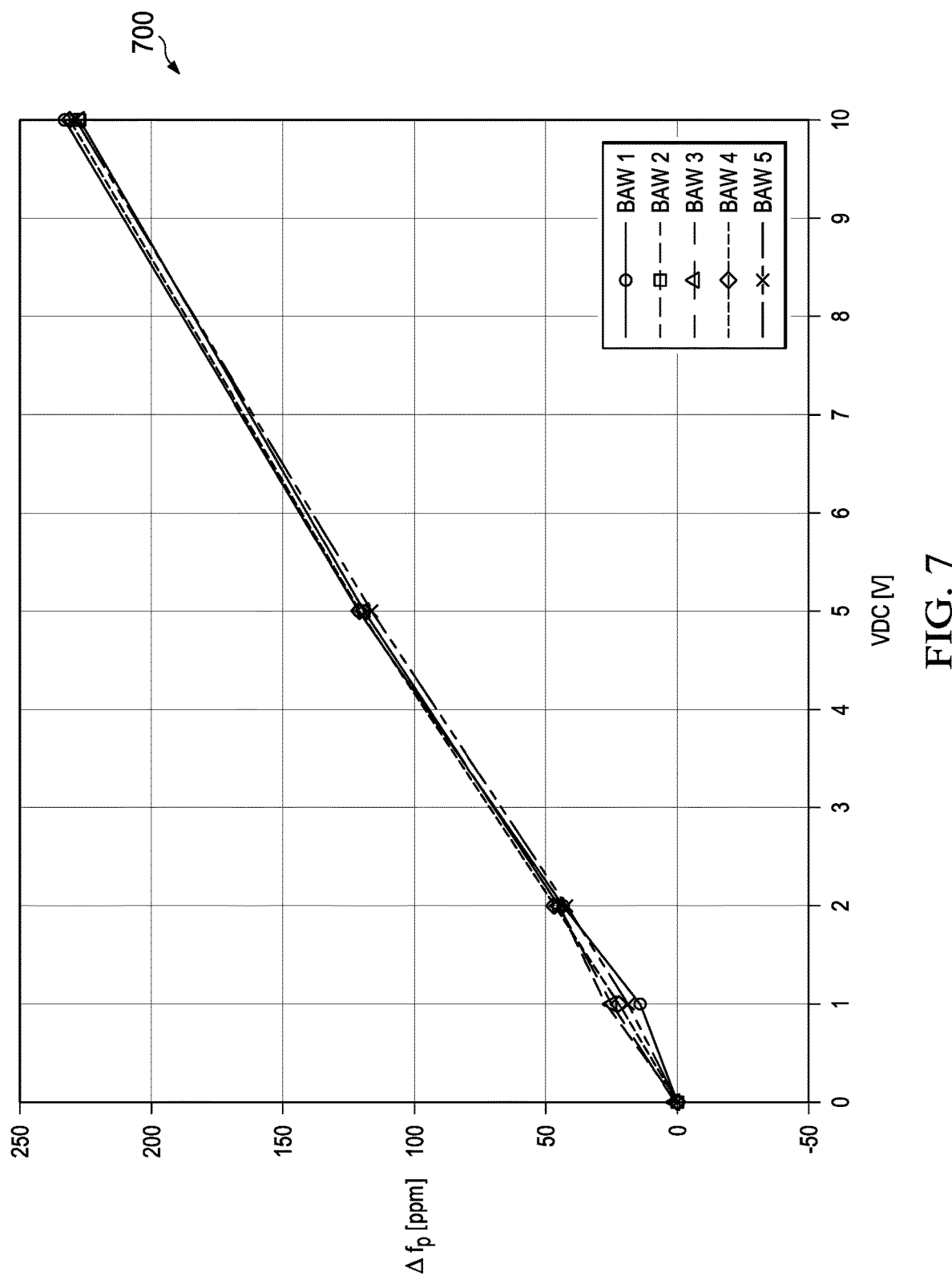
FIG. 7 is a graph representing BAW resonator frequency shift as a function of a direct current (DC) tuning voltage in accordance with various examples.

FIG. 7 shows a graph 700 representing BAW resonator frequency shift as a function of a DC tuning voltage in accordance with test results. As shown in graph 700, adjusting a DC tuning voltage by 2 volts adjusts a center frequency for each of multiple BAW resonators by approximately 50 ppm in a linear manner. The linear relationship between the DC tuning voltage and center frequency shifts means tunable BAW resonator devices should have an expected range of frequency shift for a given DC tuning signal range. Thus, tunable BAW resonator devices and related units can be made to support a desired amount of frequency shift capability.

Figure 8:
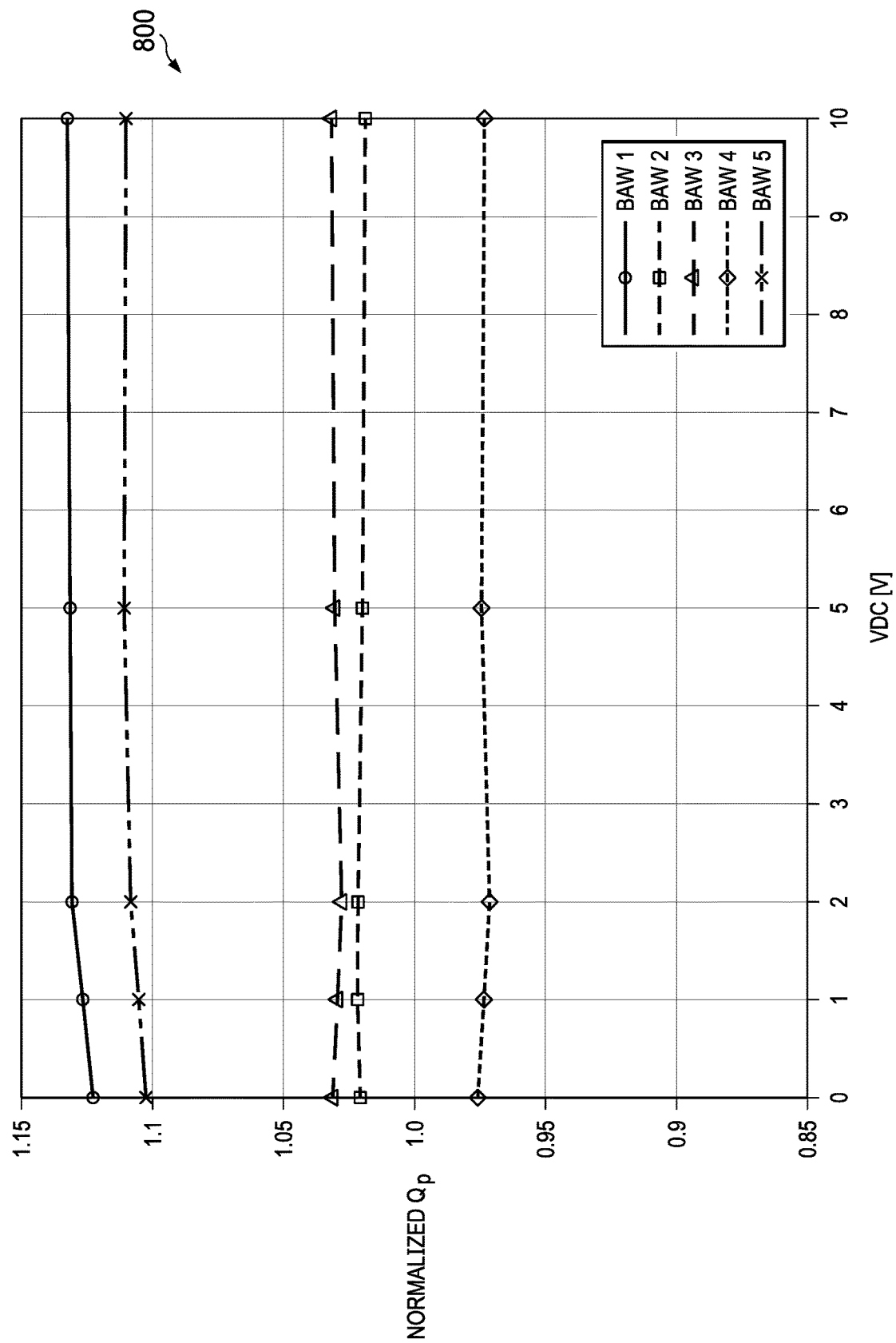
FIG. 8 is a graph representing BAW resonator quality factor as a function of a DC tuning voltage in accordance with various examples.

FIG. 8 shows a graph 800 representing BAW resonator quality factor (Q) as a function of a DC tuning voltage in accordance with test results. As shown in graph 800, adjusting a DC tuning voltage does not significantly affect a quality factor for each of multiple BAW resonators. Accordingly, the quality factor of tunable BAW resonator devices should not be significantly affected by DC tuning. Thus, each tunable BAW resonator devices described herein is expected to perform similar to a two-terminal BAW resonator device (high-impedance except at a narrow frequency range). This is an improvement over existing BAW resonator tuning schemes (e.g., coupling a capacitor across each terminal of a two-terminal BAW resonator device) that cause significant degradation in quality factor and impedance at resonance. This ultimately leads to higher phase noise and power consumption.

Figure 9:
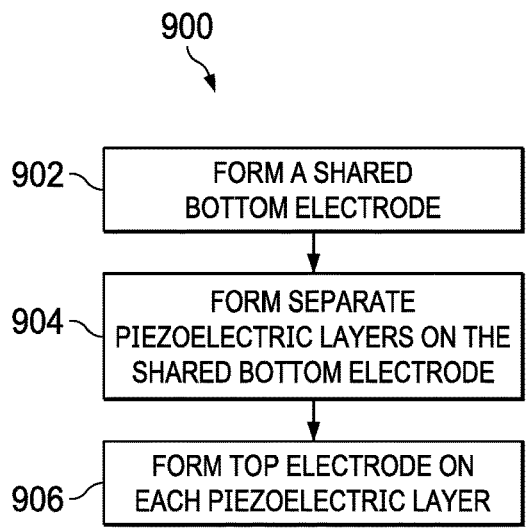
FIG. 9 is a flowchart of a tunable BAW resonator device fabrication method in accordance with various examples.

FIG. 9 shows a flowchart of a tunable BAW resonator device fabrication method 900 in accordance with various examples. As shown, the method 900 comprises forming a shared bottom electrode at block 902. At block 904, separate piezoelectric layers are formed on the shared bottom electrode. At block 906, top electrodes are formed on each piezoelectric layer. For example, the method 900 is used when fabricating a tunable BAW resonator device that includes a three-electrode BAW resonator core (such as device 160 of FIG. 1D, and the three-electrode BAW resonator core 400 of FIG. 4).

Figure 10:
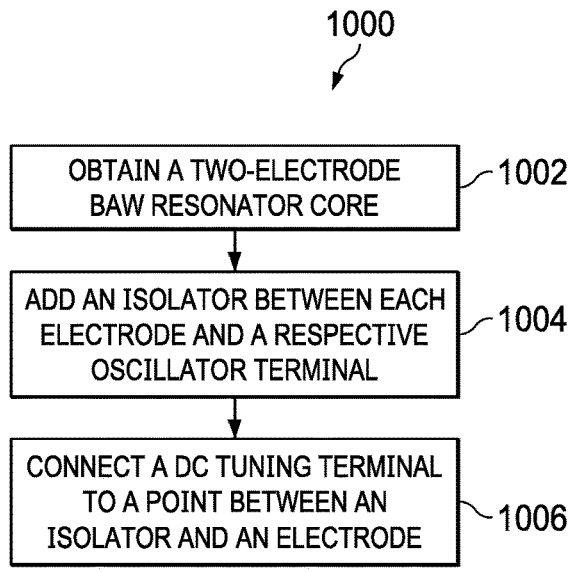
FIG. 10 is a flowchart of another tunable BAW resonator device fabrication method in accordance with various examples.

FIG. 10 shows a flowchart of another tunable BAW resonator device fabrication method 1000 in accordance with various examples. As shown, the method 1000 comprises obtaining a two-electrode BAW resonator core at block 1002. The two-electrode BAW resonator core of block 1002 can be manufactured or purchased from a supplier. At block 1004, an isolator (e.g., a capacitor or another isolation component) is added between each electrode and a respective oscillator terminal. At block 1006, a DC tuning terminal is connected to a point (such as the connection point 116 in FIG. 1A) between an isolator and an electrode of the two-electrode BAW resonator core. In various examples, the method 1000 includes additional steps, such as coupling a resistor between the DC tuning terminal and the connection point of block 1006 (such as resistor 108 in FIG. 1A). Also, another resistor (such as resistor 109 in FIG. 1A) can be added between ground and a connection point (such as the connection point 118 in FIG. 1A) between the other electrode and isolator. For example, the method 1000 is used when fabricating a tunable BAW resonator device that includes a single two-electrode BAW resonator core (such as device 100 of FIG. 1D).

Figure 11:
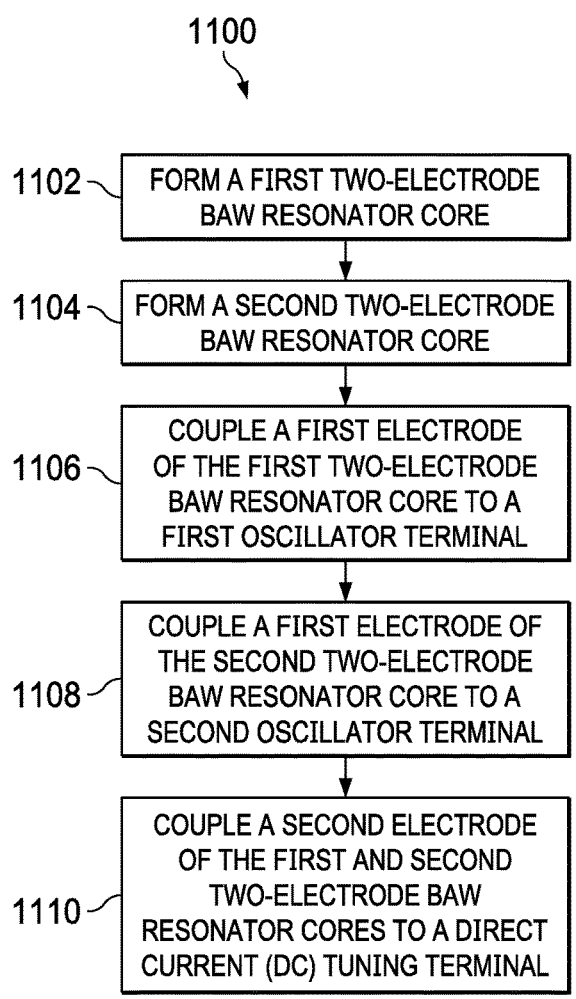
FIG. 11 is a flowchart of another tunable BAW resonator device fabrication method in accordance with various examples.

FIG. 11 shows a flowchart of a tunable BAW resonator device fabrication method 1100 in accordance with various examples. As shown, the method 1100 comprises forming a first two-electrode BAW resonator core at block 1102 (e.g., the two-electrode BAW resonator core 500 of FIG. 5). At block 1104, a second two-electrode BAW resonator core (e.g., the two-electrode BAW resonator core 530 of FIG. 5) is formed. At block 1106, a first electrode of the first two-electrode BAW resonator core is coupled to a first oscillator terminal (e.g., the top electrode 504 of the two-electrode BAW resonator core 500 in FIG. 5 is coupled to metal node 520 or an external oscillator terminal). At block 1108, a first electrode of the second two-electrode BAW resonator core is coupled to a second oscillator terminal (e.g., the top electrode 534 of the two-electrode BAW resonator core 530 in FIG. 5 is coupled to metal node 550 or an external oscillator terminal). At block 1110, respective second electrodes of the first and second two-electrode BAW resonator cores are coupled to a DC tuning terminal (e.g., the bottom electrodes 502 and 532 of the two-electrode BAW resonator cores 500 and 530 in FIG. 5 are coupled to metal nodes 522 and 552, each coupling to an external DC tuning terminal). For example, the method 1100 is used when fabricating a tunable BAW resonator device that includes a pair of two-electrode BAW resonator cores (such as device 120 or 140 of FIGS. 1B and 1C). Also, method 1100 can be combined with method 900, where performing blocks 1102 and 1104 in method 1100 involves performing blocks 902, 904, and 906 in method 900. Also, in various examples, the steps represented in methods 900, 1000, and 1100 are performed in a different order and/or are performed simultaneously.

Figure 12:
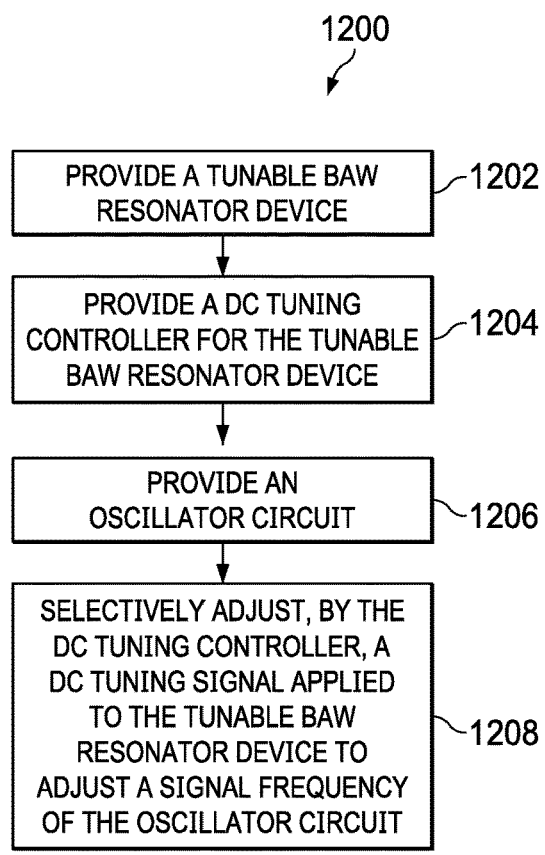
FIG. 12 is a flowchart of a method involving a tunable BAW resonator device in accordance with various examples.

FIG. 12 shows a flowchart of a method 1200 involving a tunable BAW resonator device in accordance with various examples. As shown, the method 1200 comprises providing a tunable BAW resonator device at block 1202. At block 1204, a DC tuning controller is provided for the tunable BAW resonator device. At block 1206, an oscillator circuit is provided. At block 1208, a DC tuning signal applied to the tunable BAW resonator device is selectively adjusted by the DC tuning controller to adjust a signal frequency of the oscillator circuit.

In some examples of the method 1200, the tunable BAW resonator device comprises a single two-electrode BAW resonator core, and the method 1200 further comprises coupling the single two-electrode BAW resonator core to the DC tuning controller and the oscillator circuit via isolated terminals. In some examples of the method 1200, the tunable BAW resonator device comprises a pair of two-electrode BAW resonator cores, and the method 1200 further comprises coupling the pair of two-electrode BAW resonator cores to the DC tuning controller and the oscillator circuit via isolated terminals. In some examples of the method 1200, the tunable BAW resonator device comprises a single three-electrode BAW resonator core, and the method 1200 further comprises coupling the single three-electrode BAW resonator core to the DC tuning controller and the oscillator circuit via isolated terminals. In some examples, the method 1200 also comprises: receiving, by the DC tuning controller, an ambient measurement (e.g., a temperature and/or stress measurement); and adjusting the DC tuning signal applied to the tunable BAW resonator device based on the ambient measurement. In some examples, the method 1200 also comprises: receiving, by the DC tuning controller, a drift frequency measurement or estimate; and adjusting the DC tuning signal applied to the tunable BAW resonator device based on the drift frequency measurement or estimate.

In this description, the term "couple" or "couples" means either an indirect or direct wired or wireless connection. Thus, if a first device is coupled to a second device, that connection may be through a direct connection or through an indirect connection via other devices and connections. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. A system comprising:
   a bulk acoustic wave (BAW) resonator including:
      a first electrode;
      separate first and second piezoelectric layers with respective first sides contacting the first electrode;
      a second electrode contacting a second side of the first piezoelectric layer; and
      a third electrode contacting a second side of the second piezoelectric layer, in which the third electrode is separate from the second electrode;
   an oscillator circuit coupled to the BAW resonator, the oscillator circuit configured to generate an oscillating signal having a frequency; and
   a direct-current (DC) controller coupled to the BAW resonator, the DC controller configured to adjust the frequency by adjusting a DC signal to the BAW resonator.

2. The system of claim 1, wherein the BAW resonator comprises a single three-electrode BAW resonator core.

3. The system of claim 1, wherein the DC controller is configured to adjust the DC signal based on at least one of a temperature measurement and a stress measurement.

4. The system of claim 1, wherein the DC controller is configured to adjust the DC signal based on at least one of a measured frequency drift and an estimated frequency drift.

5. A system comprising:
   a bulk acoustic wave (BAW) resonator including a single two-electrode BAW resonator core with a first electrode and a second electrode;
   an oscillator circuit having first and second terminals, the oscillator circuit coupled to the BAW resonator, and the oscillator circuit configured to generate an oscillating signal having a frequency, in which the first and second electrodes are DC isolated from the first and second terminals; and
   a direct-current (DC) controller coupled to the BAW resonator, the DC controller configured to adjust the frequency by adjusting a DC signal to the BAW resonator;
   a first resistor between a DC terminal of the BAW resonator and one of the first and second electrodes; and
   a second resistor between a ground node and the other of the first and second electrodes.

6. A system comprising:
   a bulk acoustic wave (BAW) resonator including a pair of two-electrode BAW resonator cores in different integrated circuits;
   an oscillator circuit coupled to the BAW resonator, the oscillator circuit configured to generate an oscillating signal having a frequency; and
   a direct-current (DC) controller coupled to the BAW resonator, the DC controller configured to adjust the frequency by adjusting a DC signal to the BAW resonator.

7. A method comprising:
   adjusting, by a direct-current (DC) controller, a DC signal to a bulk-acoustic wave (BAW) resonator to adjust a signal frequency of an oscillator circuit, wherein the BAW resonator includes:
      a first electrode;
      separate first and second piezoelectric layers with respective first sides contacting the first electrode;
      a second electrode contacting a second side of the first piezoelectric layer; and
      a third electrode contacting a second side of the second piezoelectric layer, in which the third electrode is separate from the second electrode.

8. The method of claim 7, wherein the BAW resonator comprises a single three-electrode BAW resonator core, and the method further comprises coupling the single three-electrode BAW resonator core to the DC controller and the oscillator circuit via isolated terminals.

9. The method of claim 7, further comprising:
   receiving, by the DC controller, an ambient measurement; and
   adjusting the DC signal to the BAW resonator based on the ambient measurement.

10. The method of claim 7, further comprising:
    receiving, by the DC controller, a drift frequency measurement or estimate; and
    adjusting the DC signal to the BAW resonator based on the drift frequency measurement or estimate.

11. A method comprising:
    adjusting, by a direct-current (DC) controller, a DC signal to a bulk-acoustic wave (BAW) resonator to adjust a signal frequency of an oscillator circuit, wherein the BAW resonator includes a single two-electrode BAW resonator core with a first electrode and a second electrode;
    coupling the single two-electrode BAW resonator core to the DC controller and the oscillator circuit via isolated terminals;
    coupling a first resistor between a DC terminal of the BAW resonator corresponding to one of the first and second electrodes; and
    coupling a second resistor between a ground node and the other of the first and second electrodes.

12. A BAW resonator device comprising:
    a BAW resonator core including:
       a first electrode;
       a second electrode;
       a third electrode, in which the third electrode is separate from the second electrode; and
       separate first and second layers of electro-active material having a physical characteristic that changes in response to a direct-current (DC) signal, wherein respective first sides of the first and second layers of electro-active material contact the first electrode, a second side of the first layer of electro-active material contacts the second electrode, and a second side of the second layer of electro-active material contacts the third electrode;
    a first oscillator terminal coupled to the second electrode;
    a second oscillator terminal coupled to the third electrode; and
    a direct current (DC) terminal coupled to the first electrode and configured to receive the DC signal to adjust a center frequency of the BAW resonator device.

13. The BAW resonator device of claim 12, wherein the BAW resonator core comprises a three-electrode BAW resonator core having the first, second, and third electrodes.

14. The BAW resonator device of claim 12, wherein the BAW resonator core, the first oscillator terminal, the second oscillator terminal, and the DC terminal are formed in a single integrated circuit.

15. A BAW resonator device comprising:
a BAW resonator core including:
a first electrode;
a second electrode; and
an electro-active material having a physical characteristic that changes in response to a direct-current (DC) signal;
a first oscillator terminal coupled to the first electrode;
a second oscillator terminal coupled to the second electrode; and
a direct current (DC) terminal coupled to one of the first and second electrodes or the electro-active material and configured to receive the DC signal to adjust a center frequency of the BAW resonator device;
wherein the BAW resonator core includes a first two-electrode BAW resonator core and a second two-electrode BAW resonator core in different integrated circuits, the first electrode coupled to the first oscillator terminal corresponds to a first electrode of the first two-electrode BAW resonator core, the second electrode coupled to the second oscillator terminal corresponds to a first electrode of the second two-electrode BAW resonator core, and a second electrode of the first two-electrode BAW resonator core and a second electrode of the second two-electrode BAW resonator core are coupled to the DC terminal.

16. A BAW resonator device comprising:
a BAW resonator core including:
a first electrode;
a second electrode; and
an electro-active material having a physical characteristic that changes in response to a direct-current (DC) signal;
a first oscillator terminal coupled to the first electrode;
a second oscillator terminal coupled to the second electrode;
a direct current (DC) terminal coupled to one of the electrodes or the electro-active material and configured to receive the DC signal to adjust a center frequency of the BAW resonator device, wherein the BAW resonator core comprises a two-electrode BAW resonator core with the first and second electrodes, wherein the first and second electrodes are DC isolated from the first and second oscillator terminals;
a first resistor between the DC terminal and one of the first and second electrodes; and
a second resistor between a ground node and the other of the first and second electrodes.

17. The BAW resonator device of claim 16, wherein the first and second electrodes are DC isolated from the first and second oscillator terminals by a respective capacitor.

18. A BAW resonator device comprising:
a BAW resonator core including:
a first electrode;
a second electrode; and
an electro-active material having a physical characteristic that changes in response to a direct-current (DC) signal;
a first oscillator terminal coupled to the first electrode;
a second oscillator terminal coupled to the second electrode; and
a direct current (DC) terminal coupled to one of the electrodes or the electro-active material and configured to receive the DC signal to adjust a center frequency of the BAW resonator device;
wherein the BAW resonator core comprises two BAW resonator cores in different integrated circuits.

19. A bulk acoustic wave (BAW) resonator device fabrication method comprising:
forming at least one BAW resonator core by:
forming a first electrode;
forming first and second piezoelectric layers with respective first sides contacting the first electrode;
forming a second electrode in contact with a second side of the first piezoelectric layer; and
forming a third electrode in contact with a second side of the second piezoelectric layer;
coupling the second electrode to a first oscillator terminal;
coupling the third electrode to a second oscillator terminal; and
coupling a direct current (DC) control terminal to the first electrode.

20. The method of claim 19, wherein the BAW resonator core is formed in a single semiconductor wafer.

* * * * *